(12) United States Patent
Ueno

(10) Patent No.: US 7,196,540 B2
(45) Date of Patent: Mar. 27, 2007

(54) IMPEDANCE MATCHING COMMONLY AND INDEPENDENTLY

(75) Inventor: Hiroki Ueno, Kokubunji (JP)

(73) Assignee: Renesas Technology Corp., Tokyo (JP)

( * ) Notice: Subject to any disclaimer, the term of this patent is extended or adjusted under 35 U.S.C. 154(b) by 68 days.

(21) Appl. No.: 10/983,723

(22) Filed: Nov. 9, 2004

(65) Prior Publication Data

US 2005/0104620 A1     May 19, 2005

(30) Foreign Application Priority Data

Nov. 14, 2003   (JP)   ............................. 2003-385745

(51) Int. Cl.
*H03K 19/003* (2006.01)

(52) U.S. Cl. .......................................... 326/30; 326/26

(58) Field of Classification Search .................. 326/30, 326/27, 83, 86, 68

See application file for complete search history.

(56) References Cited

U.S. PATENT DOCUMENTS 6,246,255 B1 *   6/2001   Takizawa ..................... 326/30

6,445,245 B1 *   9/2002   Schultz et al. ............... 327/541
6,967,500 B1 *  11/2005   Lin et al. ...................... 326/30

FOREIGN PATENT DOCUMENTS

JP            05-166931         12/1991

* cited by examiner

*Primary Examiner*—James H. Cho
(74) *Attorney, Agent, or Firm*—Reed Smith LLP; Stanley P. Fisher, Esq.; Juan Carlos A. Marquez, Esq.

(57) ABSTRACT

A semiconductor device is easy for high accuracy impedance matching against differences in impedance of a transmission line and a package wire. A semiconductor chip having external output buffers and a packaging circuit are included. Each external output buffer has a first output portion whose internal impedance is adjusted commonly with other external output buffers in accordance with impedance control data and a second output portion whose internal impedance is adjusted independently of other external output buffers. Both of the first and second output portions are connected in parallel to a common output terminal. Common adjustment by the first output portion can cope with impedance of the transmission line and individual adjustment by the second output portion can cope with a difference of package wires.

14 Claims, 13 Drawing Sheets

FIG. 5

| | REPLICA SIDE | OUTPUT SIDE | OUTPUT IMPEDANCE CALCULATION FORMULA |
|---|---|---|---|
| COMPARATIVE EXAMPLE | REPLICA SIDE DATA — REPLICA MOS:Z — TO COMPARISON CIRCUIT — PAD — WPP,BGA RESISTANCE:R2 — Ball — EXTERNAL RESISTOR:RQ | OUTPUT SIDE DATA — OUTPUT MOS:ZO — PAD — WPP,BGA RESISTANCE:R3 — Ball — OUTPUT IMPEDANCE:Z | RESISTANCE: WHEN R1 DOES NOT EXIST $Z=RQ+R2$ $ZO=Z/5$ OUTPUT $Z=ZO+R3$ $=Z/5+R3$ $=(RQ+R2)/5+R3$ $=RQ/5+(R2+5*R3)/5$ $R2+5*R3/5$ : ERROR |
| THIS INVENTION | REPLICA SIDE DATA — REPLICA MOS:Z — FG RESISTOR:R1 — TO COMPARISON CIRCUIT — PAD — WPP,BGA RESISTANCE:R2 — Ball — EXTERNAL RESISTOR:RQ | OUTPUT SIDE DATA — OUTPUT MOS:ZO — PAD — WPP,BGA RESISTANCE:R3 — Ball — OUTPUT IMPEDANCE:Z | CORRECTION RESISTANCE :WHEN R1 IS ADDED $Z+R1=RQ+R2$ $ZO=Z/5$ OUTPUT $Z=ZO+R3$ $=Z/5+R3$ $=(RQ+R2-R1)/5+R3$ $=RQ/5+(5*R3+R2-R1)/5$ ERROR CAN BE ELIMINATED BY SETTING $R1 = R2+R3*+5$ |

IMPEDANCE MATCHING COMMONLY AND INDEPENDENTLY

BACKGROUND OF THE INVENTION

This invention relates to a technology for regulating internal impedance of output buffers of a semiconductor device. For example, the invention relates to a technology that will be effective when applied to impedance matching of data output buffers in a semiconductor device such as an SRAM (Static Random Access Memory).

To reduce influences of signal reflection through a transmission line, it is necessary to highly accurately establish impedance matching that brings an internal impedance viewed from an external terminal of a semiconductor device into conformity with the impedance of a transmission line.

Because the internal impedance changes in accordance with driving capacity of output buffers, JP-A-05-166931, (especially in FIGS. 1–3) describes a circuit construction in which a plurality of clamp resistors are connected in parallel on the side of a ground potential of a push-pull output circuit and are taken out to pad electrodes of a semiconductor chip and one of the pad electrodes is selected and connected to the ground potential of the circuit at the time of assembly so that the internal impedance can be selected in accordance with the driving capacity of the output buffers.

SUMMARY OF THE INVENTION

The inventor of the invention has examined impedance matching of output buffers in a semiconductor device and has found that when wiring lengths from electrode pads of a chip to external connection electrodes (packaging electrodes) of a package, etc, are greatly different in a semiconductor device having a large number of external connection terminals even though the output buffers are the same, the difference must be individually handled in order to establish impedance matching of the output buffers. In the case of a flip chip, for example, pad electrodes of the semiconductor chip are connected to bump electrodes as external connection electrodes dispersedly arranged on the surface through rearrangement wires and the length of the rearrangement wires is not equal. The length of package wires cannot easily be made equal similarly when the flip chip is mounted to a single layer or multi-layered wiring substrate and ball-like electrodes of the wiring substrate are used as packaging terminals.

To individually set the internal impedance of all the output buffers in this case, the internal impedances of all the output buffers must be individually adjusted while matching with the impedance of a transmission line and matching with the difference of the package wires are taken into consideration and this operation is very troublesome. In addition, an adjusting error is likely to occur.

It is an object of the invention to provide a semiconductor device capable of easily establishing high accuracy impedance matching while a difference in impedance between a transmission line and package wires is taken into consideration.

The outline of typical inventions among the inventions disclosed herein will be briefly explained as follows.

[1] According to a first aspect of the invention, there is provided a semiconductor device comprising a combination of a semiconductor chip having a plurality of external output buffers with a packaging circuit portion, wherein each external output buffer includes a first output portion (31) the internal impedance of which can be adjusted commonly with other external output buffers in accordance with impedance control data and a second output portion (32) the internal impedance of which can be adjusted independently of other external output buffers, and both of the first output portion and the second output portion are connected in parallel with a common output terminal. The term "internal impedance" means the impedance viewed from the output side, that is, the output impedance.

As described above, common adjustment by the first output portion can cope with the impedance of the transmission line and individual adjustment by the second output portion can cope with the difference of the package wires. Therefore, highly accurate impedance matching can be easily achieved against the increase of the number of terminals of the external connection terminals and the unequal length of the package wires.

According to a concrete aspect of the invention, the first output portion described above is a push-pull circuit, and a mutual conductance at an output operation of the push-pull circuit can be variably controlled in accordance with impedance control data. For example, the push-pull circuit of the first output portion includes a plurality of first output transistors (Q1) that output a high level when they are connected in parallel with the output terminals and are under an ON state and a plurality of second output transistors (Q2) that output a low level when they are connected in parallel with the output terminals and are under an ON state, wherein the numbers of the first and second transistors that are turned ON at the time of the output operation are controlled in accordance with the control data, respectively.

According to another aspect of the invention, the second output portion described above is a push-pull circuit mutual conductance of which is individually adjusted at the time of the output operation. The push-pull circuit of the second output portion, for example, includes third output transistors (Q3) for outputting a high level when they are connected in parallel with the output terminal and are under an ON state and fourth output transistors (Q4) for outputting a low level when they are connected to the output terminal and are under an ON state, and a transistor size of each of the third and fourth transistors is individually decided for each output buffer.

According to still another aspect of the invention, when an ON resistance of the second output portion at the time of the output operation is regarded as a first correction resistor, the resistance of the first correction resistor of each of a plurality of external output buffers is so determined as to compensate for variance of a resistance component of an output path in each packaging circuit portion. Consequently, a variance or unevenness in the internal impedance components resulting from the unequal lengths of the package wires can be compensated for.

According to still another aspect of the invention, the semiconductor device further includes an impedance control circuit for generating the impedance control data described above, and the impedance control circuit includes a resistor voltage division circuit connected to an external resistance element to thereby form a predetermined voltage division node and a second correction resistor (RCz) connected to the voltage division node (Nvd) on the opposite side to the external resistance element while interposing the voltage division node (Nvd), and generates impedance control data (CDAT) in accordance with a voltage division level of the predetermined voltage division node. The second correction resistor resistance is determined on the basis of the resistance component of the path to which the external resistance element is connected in the packaging circuit portion and the resistance component variance of which is compensated for by the first correction resistor. Consequently, the internal impedance of the output buffer is the sum of the resistance component the variance of which is compensated for by the first correction resistor and the ON resistance of the first output portion decided in accordance with the impedance control data. Because the ON resistance of the first output portion is proportional to the voltage division node level in the resistor voltage division circuit of the impedance control circuit, the second correction resistor operates in the direction that lowers the voltage division node level in such a fashion as to lower the ON resistance of the first output portion by the resistance component compensated for by the first correction resistor. Therefore, the internal impedance of the output buffer is apparently set to a value indexed by the value of the external resistor such as 1/n of the external resistor.

According to still another aspect of the invention, the semiconductor device is a flip chip. In other words, the semiconductor chip includes a semiconductor substrate, a plurality of circuit elements formed on an element formation layer on the semiconductor substrate and a plurality of pad electrodes formed on a surface of the element formation layer and connected to the circuit element, wherein the packaging circuit portion includes a conductor layer connected to predetermined ones of the pad electrodes and extending on the element formation layer and bump electrodes combined with the conductor layer and constituted as a flip chip. In this case, the package wire is a signal path extending from the pad electrode to the bump electrode.

According to still another aspect of the invention, the semiconductor device is constituted by mounting a flip chip on a wiring substrate having ball-like electrodes as packaging terminals. In other words, the semiconductor chip includes a semiconductor substrate, a plurality of circuit elements formed on an element formation layer on the semiconductor substrate and a plurality of pad electrodes formed on a surface of the element formation layer and connected to the circuit element. The packaging circuit includes a conductor layer connected to predetermined ones of the pad electrodes and extending on the element formation layer, bump electrodes formed on the conductor layer, singe-layered or multi-layered wires and through-holes connected to the bump electrodes, and ball-like electrodes connected to predetermined ones of the single-layered or multi-layered wires and functioning as packaging terminals. In this case, the package wire is a signal path extending from the pad electrode to the ball-like electrode through the bump electrode.

[2] According to the second aspect of the invention, there is provided a semiconductor device comprising a combination of a semiconductor chip having a plurality of external output buffers with a packaging circuit portion, wherein the packaging circuit portion has wires and external connection terminals connected to the external output buffers, and the external output buffer includes a first correction resistor against a resistance component parasitically existing in the wires and the external connection terminals each connected to the external output buffers, the correction resistor compensates for a variance in a resistance component corresponding to each of the correction resistor, and the first correction resistor is constituted by a push-pull circuit whose mutual conductance at the time of an external output operation is adjusted independently of other output buffers. The difference between the package wires can be adjudged individually by the ON resistance of the push-pull circuit.

The external output buffer further includes another push-pull circuit whose mutual conductance at the time of an output operation is controlled variably and commonly with other external output buffers in accordance with impedance control data. The internal impedance corresponding to the transmission line impedance can be collectively adjusted for all the output buffers by the ON resistance of the push-pull circuit.

The semiconductor device further includes an impedance control circuit for generating the impedance control data. The impedance control circuit includes a resistor voltage division circuit connected to an external resistance element and forming a predetermined voltage division node and a second correction resistor connected to the voltage division node on the opposite side to the external resistance element while interposing the voltage division node, and generates impedance control data in accordance with a voltage division level of the predetermined voltage division node. The second correction resistor is decided on the basis of a resistance component of a path to which the external resistance element is connected in the packaging circuit portion and by the resistance component the variance of which is compensated for by the first correction resistor. Consequently, the internal impedance of the output buffer is apparently set to a value indexed by the value of the external resistance such as 1/n of the external resistance.

According to the invention, high accuracy impedance matching can be easily achieved while the difference in impedance between the transmission line and the package wire is taken into account and can improve impedance matching with the transmission line.

The above and other objects, features and advantages of the invention will become more apparent from the following description of the specification taken in conjunction with the accompanying drawings.

BRIEF DESCRIPTION OF THE DRAWINGS

FIG. 5 is an explanatory view showing a calculation method of output impedance in the construction shown in FIG. 4;

DETAILED DESCRIPTION OF THE EMBODIMENTS

Figure 1:
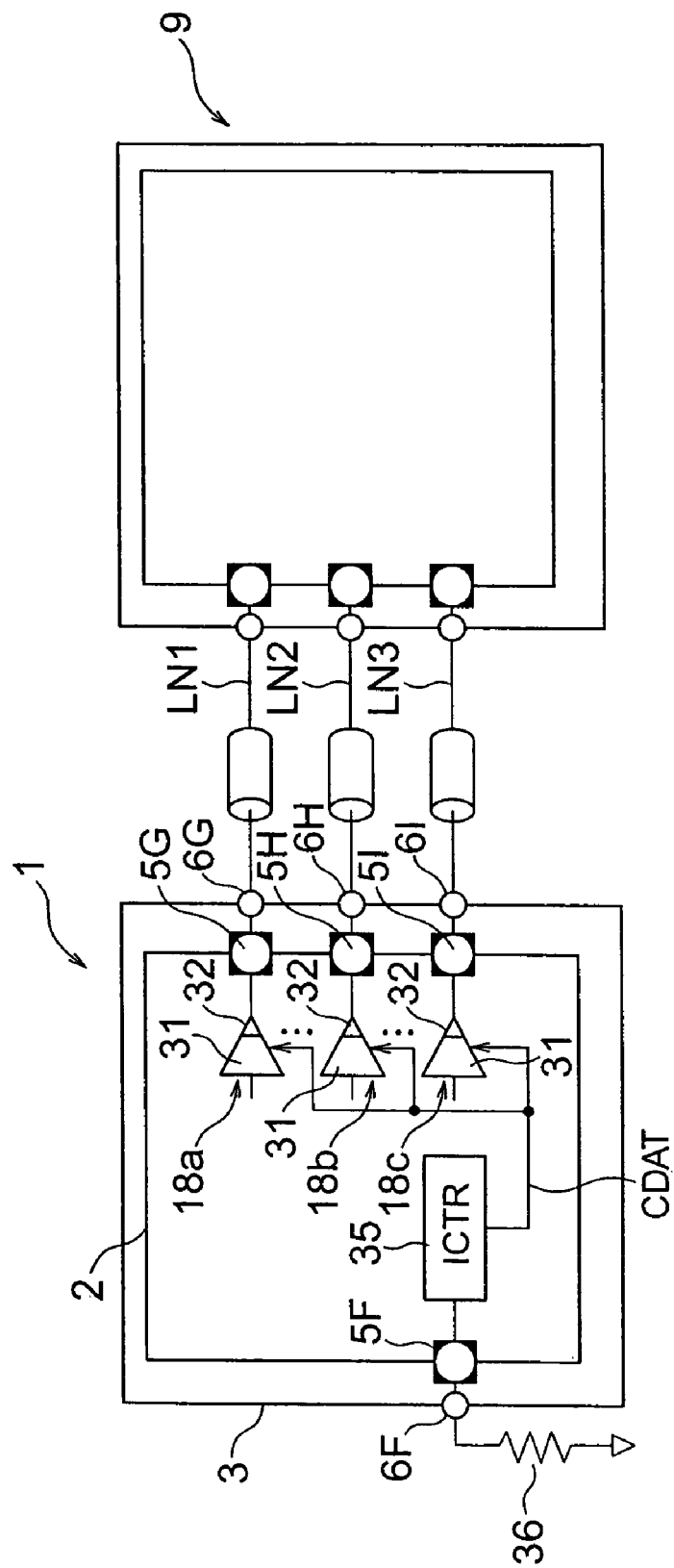
FIG. 1 is a block diagram mainly showing a construction of impedance matching of an SRAM as an example of a semiconductor device according to an embodiment of the invention.

FIG. 1 mainly shows an impedance matching structure of an SRAM as an example of the semiconductor device according to the invention. The SRAM 1 shown in the Figure is fabricated on one semiconductor substrate such as a single crystal silicon substrate by a CMOS integrated circuit fabrication technology, or the like.

The SRAM 1 includes an SRAM chip 2 as a semiconductor chip (pellet) and a packaging circuit portion (hereinafter called also "package") 3 combined with the SRAM 2, though the construction is not restrictive, in particular. The package 3 will be later described in detail but a construction for face-down package is hereby assumed. The SRAM chip 2 has a plurality of pad electrodes 5F, 5G to 5I typically shown as representatives of external terminals. The package 3 has a plurality of external connection terminals (packaging terminals) 6F, 6G to 6I typically shown as representatives of packaging terminals for packaging the SRAM 1 to a packaging substrate (not shown in the drawing). The pad electrodes 5G to 5I are connected to the external connection terminals 6G to 6I through wires of the package 3 and the external connection terminals 6G to 6I are data output terminals. The external connection terminals 6G to 6I are connected to data input terminals of a microprocessor 9 through data bus lines LN1 to LN3 typically shown.

The SRAM chip 2 has three data output buffers 18a to 18c as representatives of external output buffers. Output terminals of the data output buffers 18a to 18c are connected to the pad electrodes 5G to 5I described above. Each data output buffer 18a to 18c has a first output portion 31 the internal impedance of which can be commonly adjusted with other external output buffers in accordance with impedance control data CDAT and a second output portion 32 the internal impedance of which can be adjusted independently of other external output buffers. These first and second output portions 31 and 32 are connected parallel to a common output terminal. The term "internal impedance" means an impedance viewed from the output side, that is, an output impedance. An impedance control circuit (ICTR) 35 generates the impedance control data CDAT described above. The impedance control data CDAT is decided on the basis of a resistance value of an external resistance element 36 connected to the external connection terminal 6F, or the like. When the transmission line impedance of the data bus lines LN1 to LN3 or characteristic impedance is RQ/N, for example, the resistance value of the external resistance element 36 is set to RQ so that the internal impedance of the data output buffer 18a to 18c achieves RQ/N, where N denotes the number of the data bus lines.

Accordingly, common adjustment by the first output portion 31 can cope with impedance of the transmission line and individual adjustment by the second output portion 32 can cope with differences of wiring resistances of the package wires, that is, wire resistance on the package, parasitic capacitance and inductance components in respect of the respective output buffers. Therefore, even when the number of external connection terminals increases or even when the length of package wires is not equal, impedance matching of the data output buffers can be readily established with high accuracy with the transmission line impedance.

Figure 2:
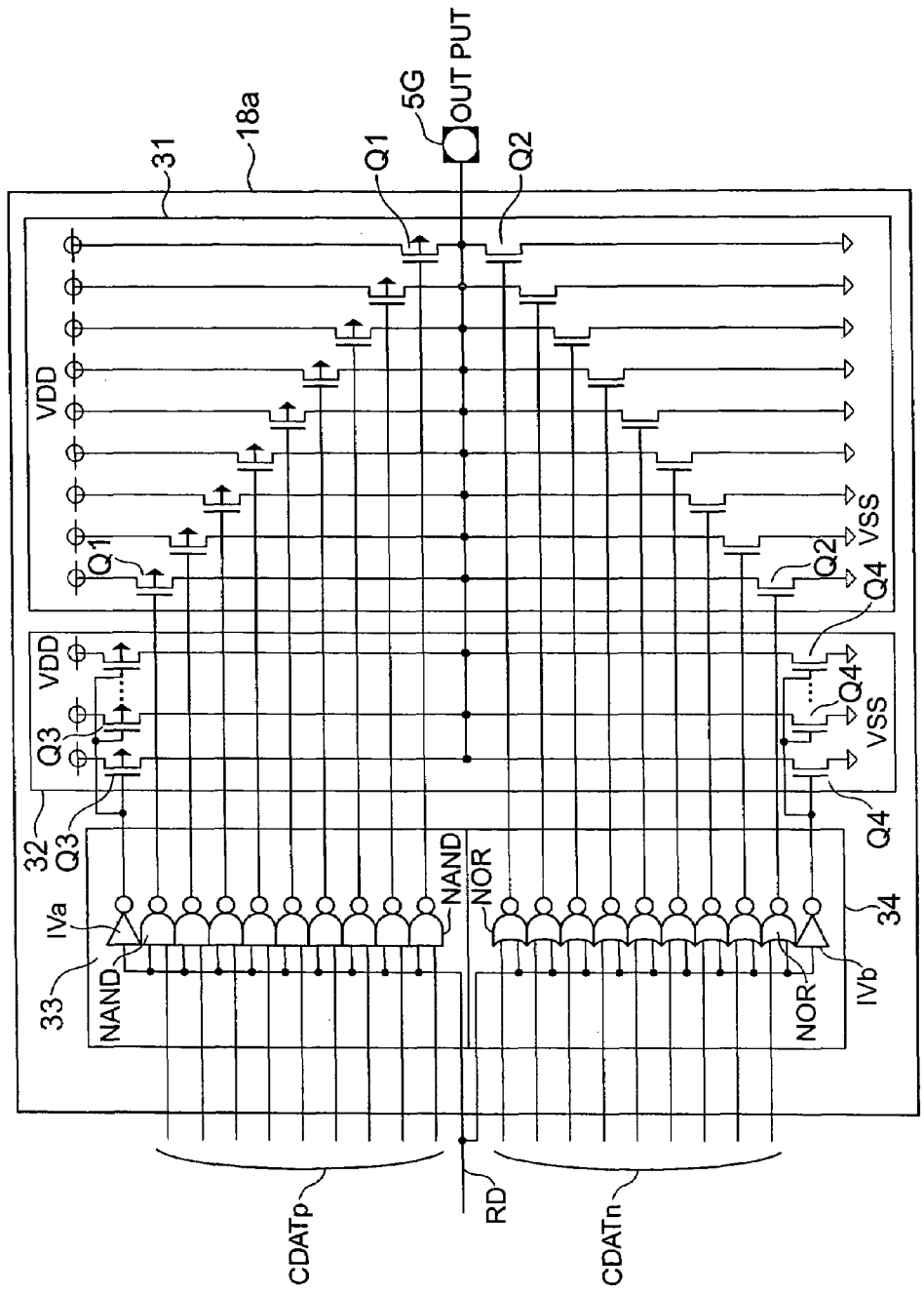
FIG. 2 is a logical circuit diagram showing an example of a data output buffer.

FIG. 2 shows an example of the data output buffer 18a. The data output buffer 18a includes pre-buffers 33 and 34 and first and second output portions 31 and 32. The first output portion 31 is a push-pull circuit the mutual conductance of which is variably controlled during the output operation in accordance with the impedance control data CDAT (CDATp, CDATn). The first output portion 31 of push-pull circuit includes, for example, a plurality of p channel type first output MOS transistors (first output transistors) Q1 that output a high level when they are connected in parallel to the output terminal 5G and are under the ON state, and a plurality of n channel type second output MOS transistors (second output transistors) Q2 that output a low level when they are connected in parallel to the output terminal 5G and are under the ON state.

The second output portion 32 is a push-pull circuit the mutual conductance of which is adjusted independently of the other second output portions 32 during the output operation. The second output portion 32 of push-pull circuit includes, for example, p channel type third output MOS transistors Q3 (third output transistors) outputting the high level when they are connected parallel to the output terminal 5G and are under the ON state and n channel type fourth output MOS transistors Q4 (fourth output transistors) outputting the low level when they are connected parallel to the output terminal 5G and are under the ON state.

The impedance control data CDAT includes data CDATp and CDATn. The impedance control data CDATp for the p channel type MOS transistors is for the first output MOS transistors Q1 and the impedance control data CDATn for the n channel MOS transistors is for the second output MOS transistors Q2. The control data CDATp is supplied to the pre-buffer 33 and the control data CDATn, to the pre-buffer 34. The control data CDATn has the number of gates NAND corresponding to the bit number of the control data CDATp and one inverter IVa. A corresponding bit of the control data CDATp is individually applied to one of the input terminals of the NAND gate NAND and read data RD is commonly supplied to the other input terminal. The pre-buffer 34 has the number of NOR gates corresponding to the bit number of the control data CDATn and one inverter IVb. A corresponding bit of the control data CDATn is individually applied to one of the input terminals of the NOR gate NOR and read data RD is commonly supplied to the other input terminal. Consequently, the number of first output MOS transistors Q1 that are turned ON in the high level output operation at RD=1 corresponds to the bit number of the logical value "1" of the control data CDATp. The number of second output MOS transistors Q2 that are turned ON in the low level output operation at RD=0 corresponds to the bit number of the logical value "0" of the control data CDATn. The ON resistance of the first output portion 31 is decided depending on the number of MOS transistors that are turned ON in the output operation.

The output of the inverter IVa is supplied in parallel to the third output MOS transistors Q3 of the second output portion 32 and the output of the inverter IVb is supplied in parallel to the fourth output MOS transistors Q4. Consequently, the ON resistance of the second output portion 32 is decided for each output buffer depending on the transistor size of the output buffer, or in short, the number of the MOS transistors Q3 and Q4 that are juxtaposed.

When the ON resistance of the MOS transistors Q3 and Q4 in the output operation of the second output portion 32 is assumed as the first correction resistor, the first correction resistor of each of the plurality of data output buffers 18a to 18c is so determined as to compensate for the variance of the resistance components of the output path of each package 3. In consequence, the variance of the internal impedance components resulting from the unequal length of the package wires can be compensated.

Figure 3:
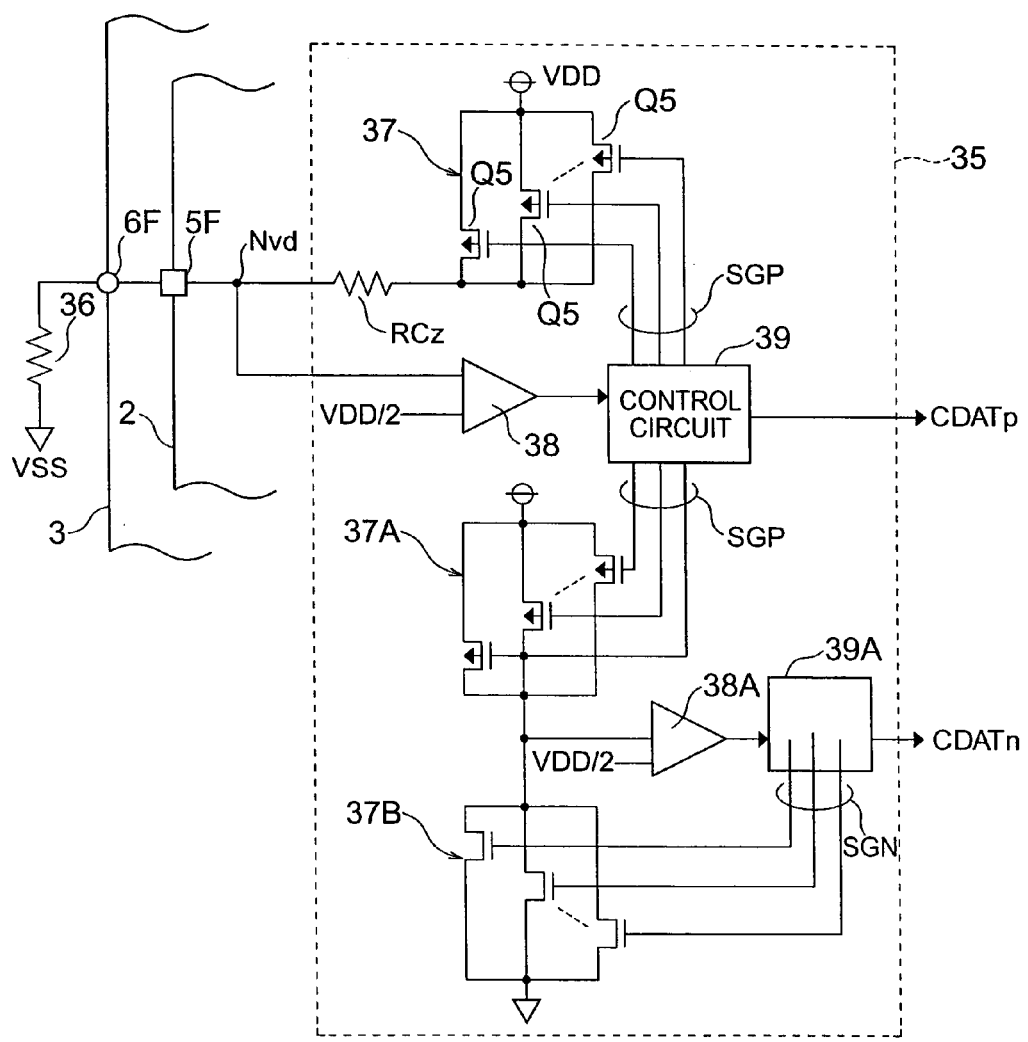
FIG. 3 is a circuit diagram showing a concrete example of an impedance control circuit.

FIG. 3 shows a concrete example of an impedance control circuit 35. The impedance control circuit 35 includes a variable resistance circuit 37, a voltage comparator 38 and a control circuit 39. The variable resistance circuit 37 is constituted by a plurality of p channel type MOS transistors Q5 connected in parallel. A path extending from a power source voltage VDD to a ground voltage VSS of the circuit through the variable resistance circuit 37, terminals 5F and 6F and an external resistance element 36 is regarded as a resistor voltage division circuit having a predetermined voltage division node Nvd. The impedance control circuit 35 has a second correction resistor RCz connected to the voltage division node Nvd on the opposite side to the external resistance element 36 while interposing the voltage division node Nvd. The voltage comparator 38 compares the level of the voltage division node Nvd with a reference potential VDD/2. The control circuit 39 selects the ON resistance of the variable resistance circuit 37 by a selection signal SGP in accordance with the comparison result and controls the ON resistance so that the level of the voltage division node Nvd is equal to the reference potential VDD/2.

In this example, the bit string of the selection signal SGp is the impedance control data CDATp. The impedance control circuit 35 further includes a variable resistance circuit 37A that is the same as the variable resistance circuit 37 and a variable resistance circuit 37B that is connected in series with the variable resistance circuit 37A. The voltage comparator 38A compares a potential at the connection node (second voltage division node) of these variable resistance circuits 37A and 37B with the reference potential VDD/2. The control circuit 39A controls the ON resistance of the variable resistance circuit 37B by the control signal SN of a plurality of bits on the basis of the comparison result so that the voltage of the second voltage division node is in agreement with the reference potential VDD/2. In consequence, the control circuit 39A generates the impedance control data CDATn for the n channel type MOS transistors in accordance with the control signal SGN at that time.

In a preferred form, the variable resistance circuit 37 is constituted as a replica circuit of the circuit formed of the p channel type MOS transistors Q1 of the first output circuit portion 31. The variable resistance circuit 37B is constituted as a replica circuit of the circuit formed of the n channel type MOS transistors Q2 of the first output circuit portion 31. The size of the transistor Q5 is 1/N of Q1 (size of n channel type MOS transistor of variable resistance circuit 37B is 1/N of Q2) such as ⅕. Assuming that the resistance component on the VSS side is only the external resistance element 36 while interposing the voltage division node Nvd and the resistance component on the VDD side is only the variable resistance circuit 37, the resistance value of the variable resistance circuit 37 is equal to that of the external resistance element 36 and the ON resistance of the first output portion receiving the impedance control data CDATp or CDATn is controlled at this time to ⅕ of the resistance value. Under such an ideal state, an external resistance 36 having a resistance value 5 times the transmission impedance of the data signal line connected to the data output buffer may well be connected to the terminal. In practice, however, a resistance component that cannot be ignored exists in the data output wirings of the package 3. Moreover, because the data output wirings of the package 3 have unequal length, a variance that cannot be ignored exists in such a resistance component. When the ON resistance during the output operation of the second output portion 32 is grasped as the first correction resistor as described above, the variance of the internal impedance component resulting from the unequal length of the package wirings can be eliminated by deciding the first correction resistor of each of the external output buffers in such a manner as to compensate for the variance of the resistance component in the output path on the package. Even after the variance is eliminated, a resistance component that is substantially constant remains in each output path on the package of the plurality of external output buffers. An undesirable resistance component resulting from the package wirings exists in the resistance voltage division paths on the package on the side of the impedance control circuit 35, too. The resistance value of the second correction resistor RCz may be determined in such a manner as to cancel the influences of both resistance components.

Figure 4:
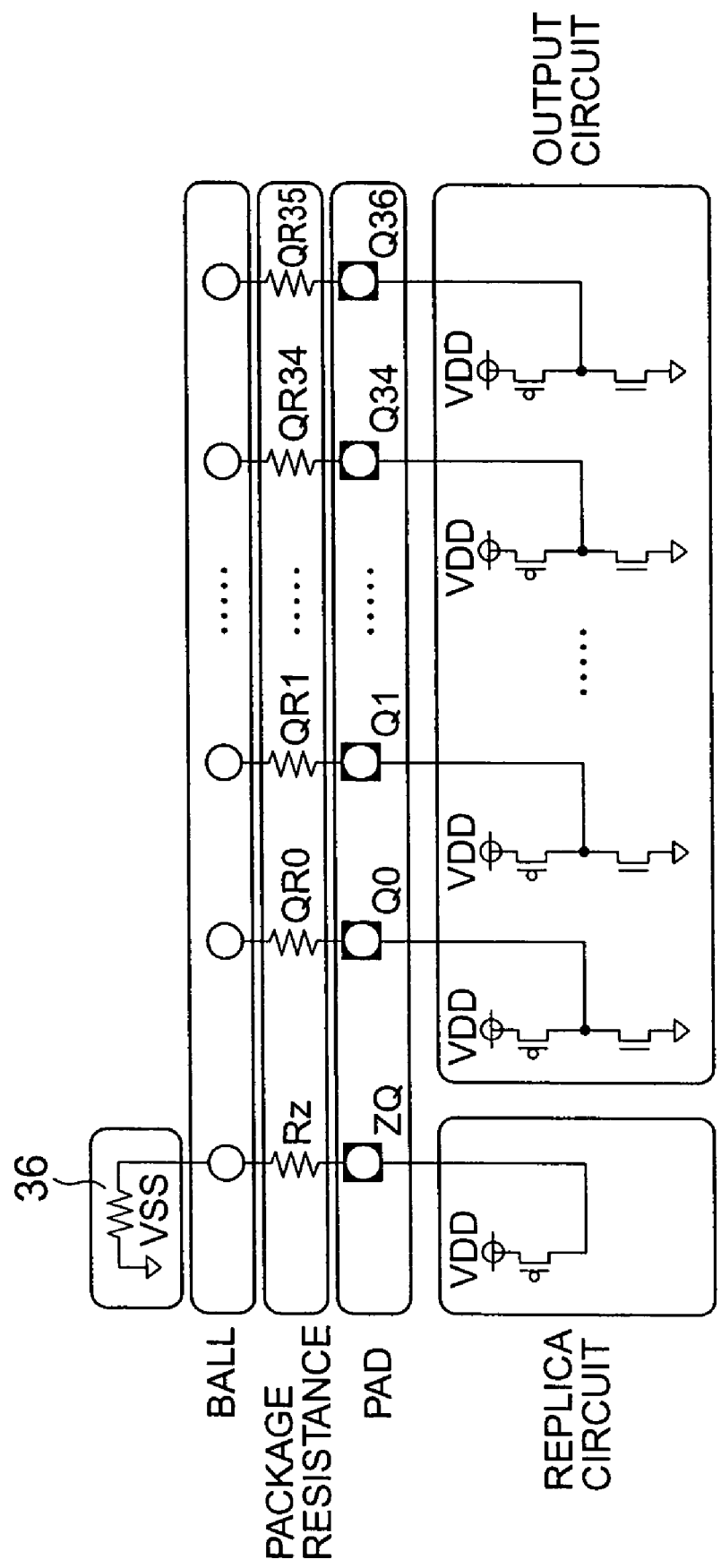
FIG. 4 is an explanatory view showing a resistance component as a representative of resistance components existing in a data output circuit and a resistor voltage division circuit.

FIG. 4 shows resistance component as representatives existing in the data output circuit and in the resistor voltage division circuit. Symbols QR0 to QR35 represent package resistance resulting from the unequal wiring length, etc. Assuming that a resistance inherent to the output circuit forms the first correction resistance, since the first correction resistor compensates for variance of the package resistance, a combined resistance value of the first correction resistor and the package resistance is substantially same in the respective data output circuits. This combined resistance value that is substantially same will be called "resistor R3" for the sake of convenience.

FIG. 5 shows a calculation formula of the output impedance in the construction shown in FIG. 4. It will be assumed hereby that RQ in FIG. 5 is the resistance value of the external resistance element 36, R2 is the resistance value of the package resistor Rz on the side of the resistor voltage division circuit (replica circuit), R1 is the resistance value of the second correction resistor RCz, Z is the resistance value of the variable resistance circuit 37 and Z0 is the ON resistance of the first output portion 31 in the data output buffer. R3 has the meaning described above. Then, since the reference potential of voltage comparison is VDD/2, the relation Z+R1=RQ+R2 is satisfied. The characteristics of the replica circuit are so set as to satisfy the relation Z0=Z/5, for example. The output impedance (output Z) of the output buffer becomes Z=Z0+R3. When these relations are put in order, the output Z=RQ/5+(5×R3+R2−R1)/5. Therefore, the error can be eliminated by setting R1=5×R3+R2.

Figure 6:
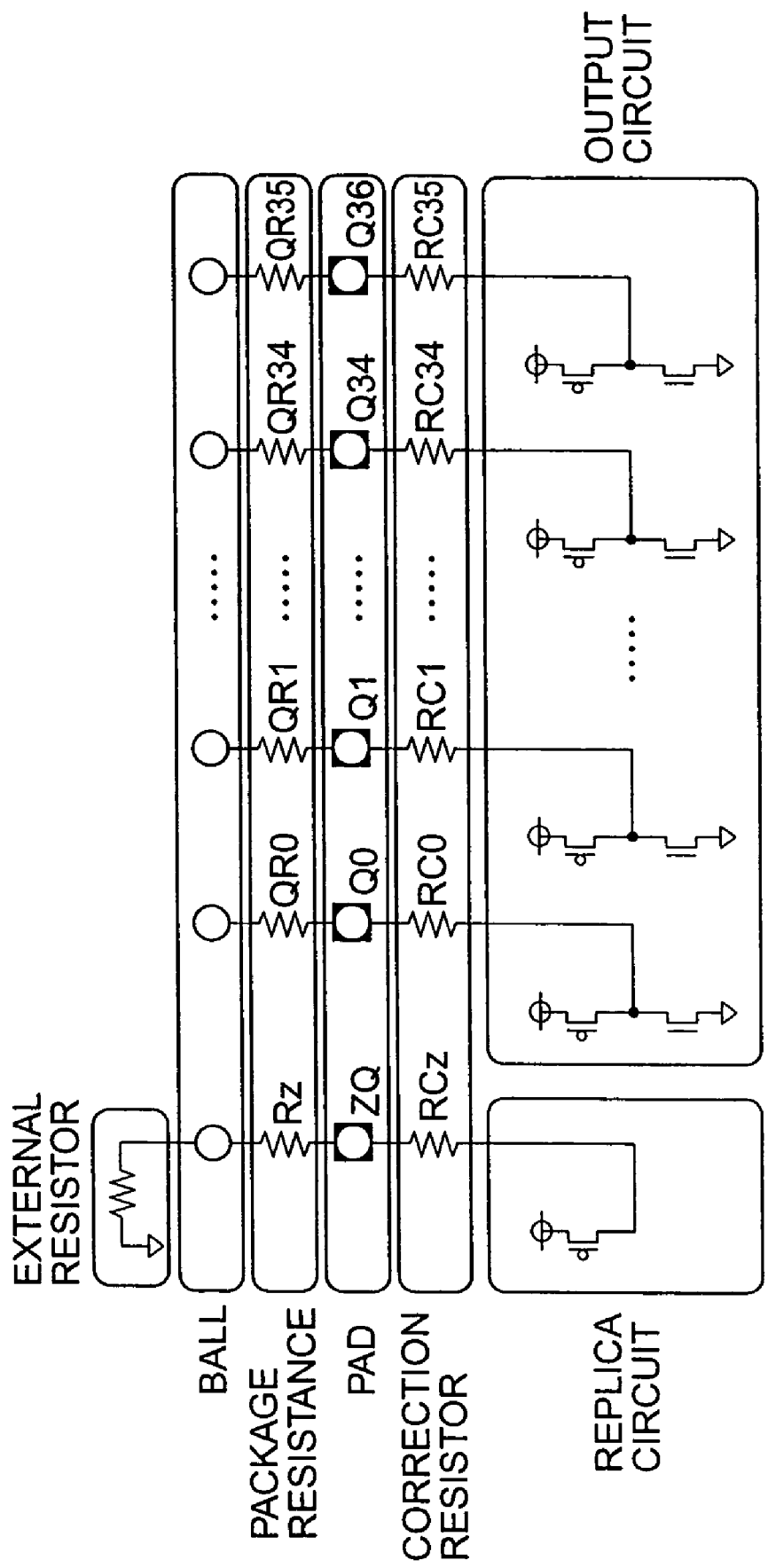
FIG. 6 is an explanatory view of a resistance component as a representative of resistance components existing in a data output circuit and a resistor voltage division circuit according to a Comparative Example when first and second correction resistors are not disposed.

When the first correction resistor and the second correction resistor are not disposed as in Comparative Example shown in FIG. 6, the error R2+5×R3/5 that cannot be cancelled remains in the output impedance (output Z) of the output buffer as tabulated in the column of Comparative Example in FIG. 5.

The second correction resistor RCz is preferably constituted by a poly-silicon resistor or a diffusion resistor. Because a large current is caused to flow through the output circuit and the replica circuit, a wiring width must be increased depending on a migration reference when copper or aluminum is used for the wiring resistance, and the area disadvantageously increases, too. Since the resistance value R1 operates similarly on each output buffer, it is necessary for the first correction resistor of the output circuit to set the resistance value so that the combined resistance of the package resistance and the internal resistance of the output buffer becomes substantially equal at each output terminal.

Figure 7:
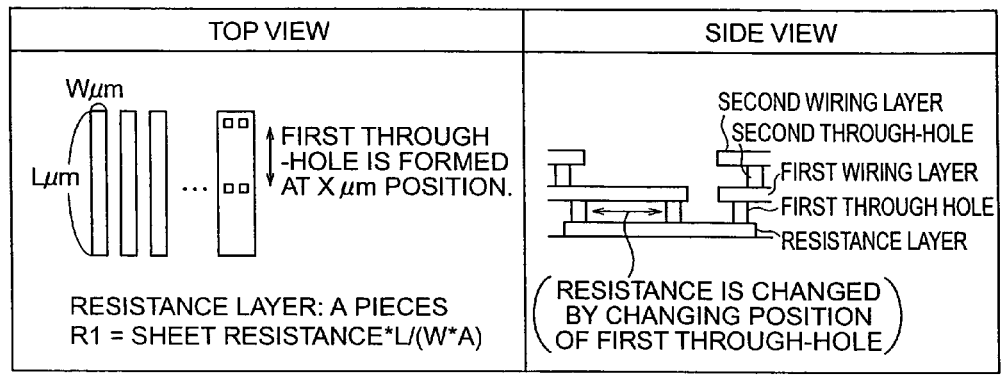
FIG. 7 is an explanatory view typically showing a construction for deciding a resistance value R1 of the second correction resistor RCz.

FIG. 7 typically shows a construction for setting the resistance value R1 of the second correction resistor RCz. The resistance value is changed by adjustably setting the position of first through-holes.

Figure 8:
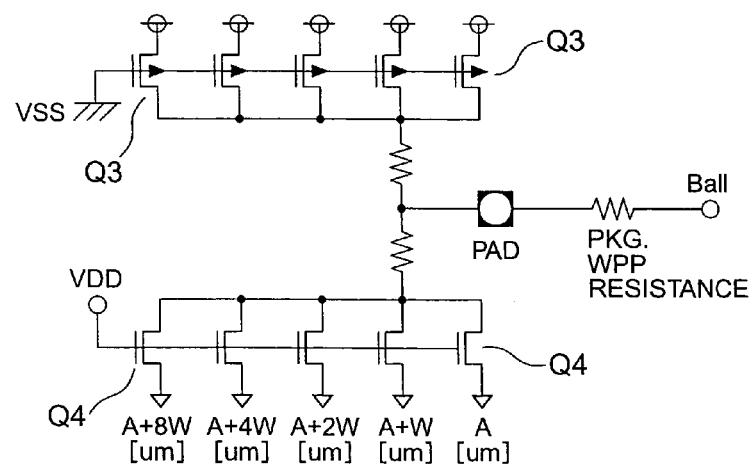
FIG. 8 is an explanatory view typically showing a size ratio of MOS transistors that constitute a second output portion.

FIG. 8 typically shows a size ratio of the MOS transistors constituting the second output portion 32. The size of each of a plurality of MOS transistors Q4 may be changed and used as typically represented on the side of the n channel type MOS transistors. This also holds true of the p channel type MOS transistors Q3.

Figure 9:
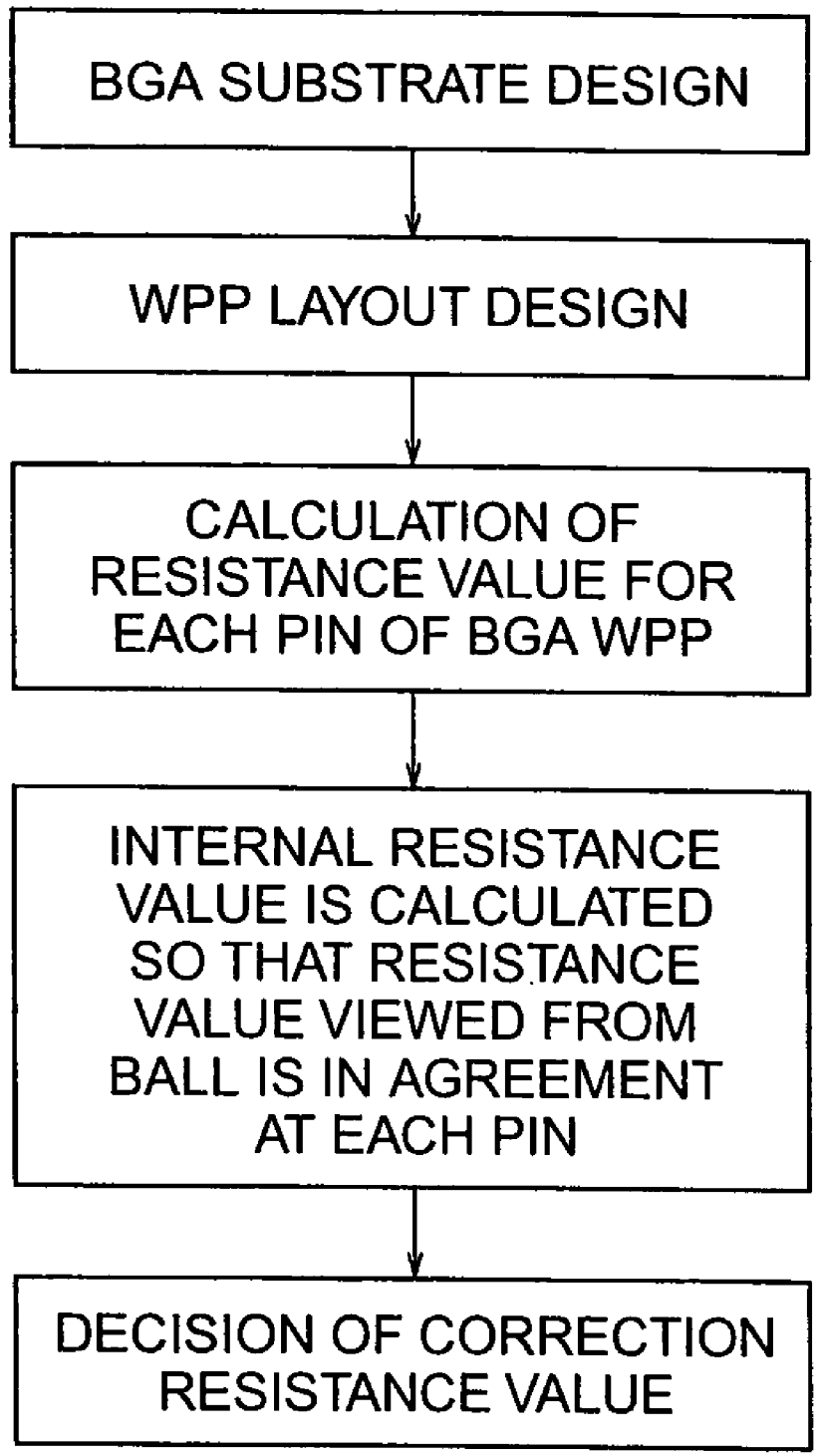
FIG. 9 is an explanatory view showing an outline of a resistance value decision processing flow of the correction resistor.

FIG. 9 shows an outline of a resistance value determining processing flow of the correction resistor. Substrate design of a package such as BGA (Ball Grid Array) substrate design is made and then internal design such as WPP (Wafer Process Package) layout design is made. Therefore, the impedance value of each terminal is calculated at the time of substrate design and the correction resistor resistance value is calculated on the basis of the impedance value to cancel the error explained with reference to FIG. 5. The correction resistance value is thus adjusted and determined in the stage of internal design.

Figure 10:
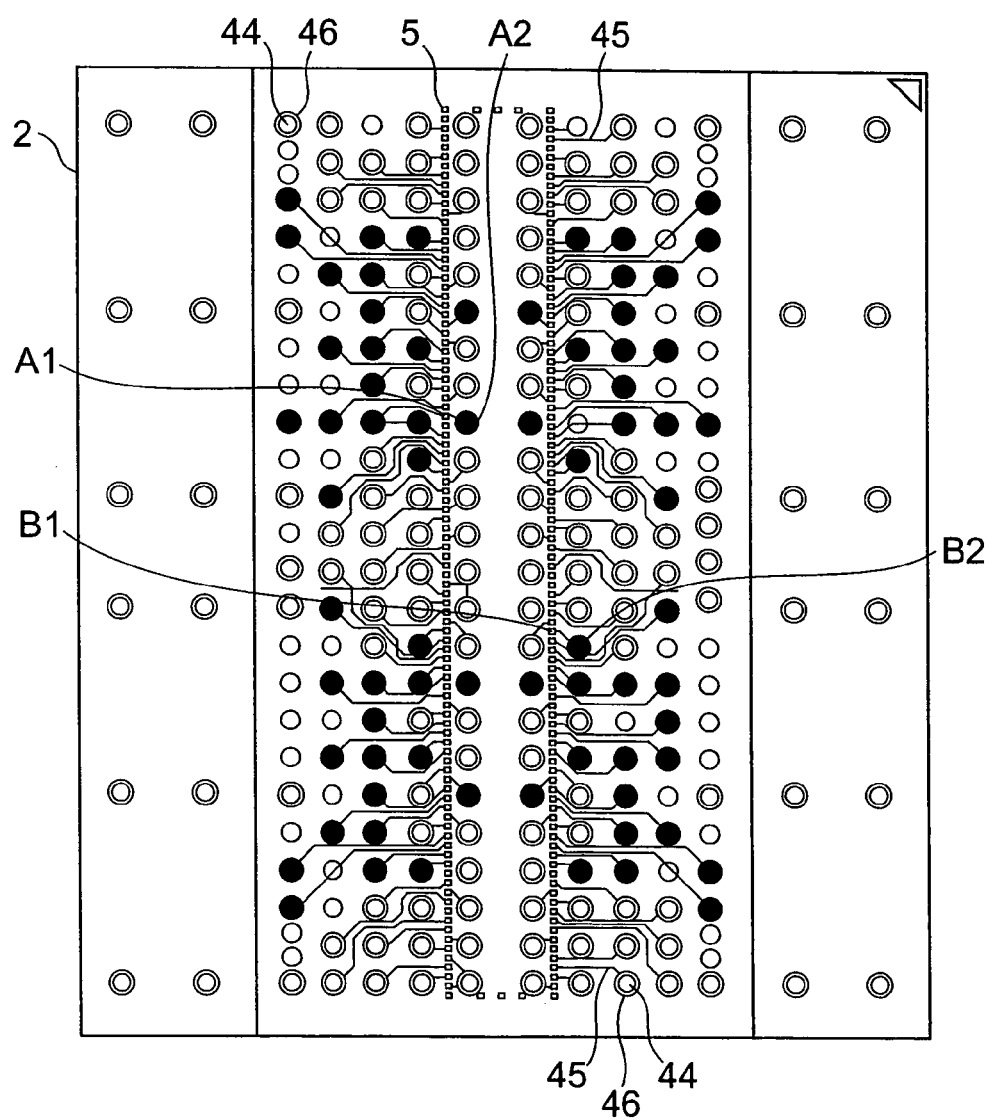
FIG. 10 is a plan view showing a planar construction of a pad electrode surface of an SRAM chip by a structure such as a flip chip.

FIG. 10 shows a planar structure of the pad electrode surface of the SRAM chip 2 in a structure like a flip chip. The pad electrodes such as 5G are expressed by small rectangular shape and are arranged at the center of the chip. The surface of the SRAM chip 2 is covered with an insulating film while the pad electrodes (reference numeral 5 generically denotes the pad electrodes) are exposed. A large number of bump electrodes (reference numeral 44 generically represents the bump electrodes) having a relatively large size are arranged in a broad range and the pad electrodes 5 and the bump electrodes 44 corresponding to one another are connected by re-arrangement wires (reference numeral 45 generically denotes the re-arrangement wires), forming the flip chip structure. Small circles inside the symbols represented by concentric circles represent the bump electrodes 44 and large circles on the outside represent bump lands (reference numeral 46 generically represents the bump lands) for placing the bump electrodes formed at the end portion of the re-arrangement wires 45.

Figure 11:
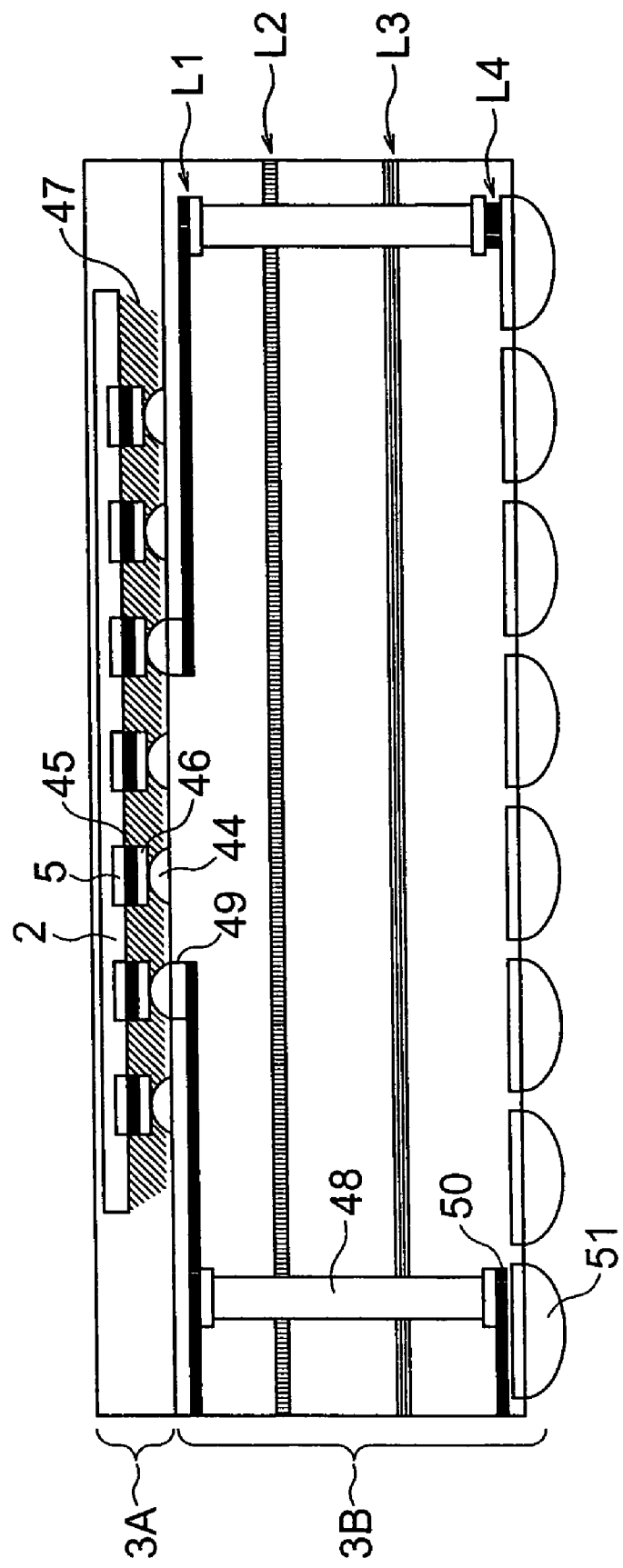
FIG. 11 is a sectional view typically showing a longitudinal sectional structure of the SRAM.

FIG. 11 typically shows a longitudinal sectional structure of the SRAM. The package 3 includes a face-down packaging structure 3A of the flip chip and a multi-layered wiring substrate 3B in relation with the SRAM chip 2.

In the SRAM chip 2, circuit elements for constituting the SRAM are formed on a semiconductor substrate such as single crystal silicon and pad electrodes 5 for the connection with the circuit elements are exposed on the surface. The pad electrodes 5 have a small area such as bonding pads and are arranged in a high density. One of the ends of each re-arrangement wire 45 is connected to the pad electrode 5 and the other end is dispersed on the chip. Bump electrodes 44 are arranged in an array form (in an area array form) on bump lands 46 at the other end of the re-arrangement wires 45. The bump electrodes 44 arranged in the array form are exposed from an insulating film 47. Accordingly, the bump electrodes 44 are arranged with greater gaps than those of the pad electrodes 5 and face-down packaging becomes easy.

A multi-layered wiring substrate 3B has four layers of conductor layers L1 to L4 that are insulated from one another. The conductor layer L3 constitutes a power source plane to which the power source voltage VDD is supplied and the conductor layer L2 constitutes a ground plane to which the ground potential VSS of the circuit is supplied. The conductor layer L1 is connected to predetermined bump electrodes 44, etc, through the bump lands 49. The conductor layer L4 is connected to predetermined ball-like electrodes 51, etc, through the ball lands 50. The conductor layer L1 is connected to the conductor layer L4 through a through-hole 48.

Figure 12:
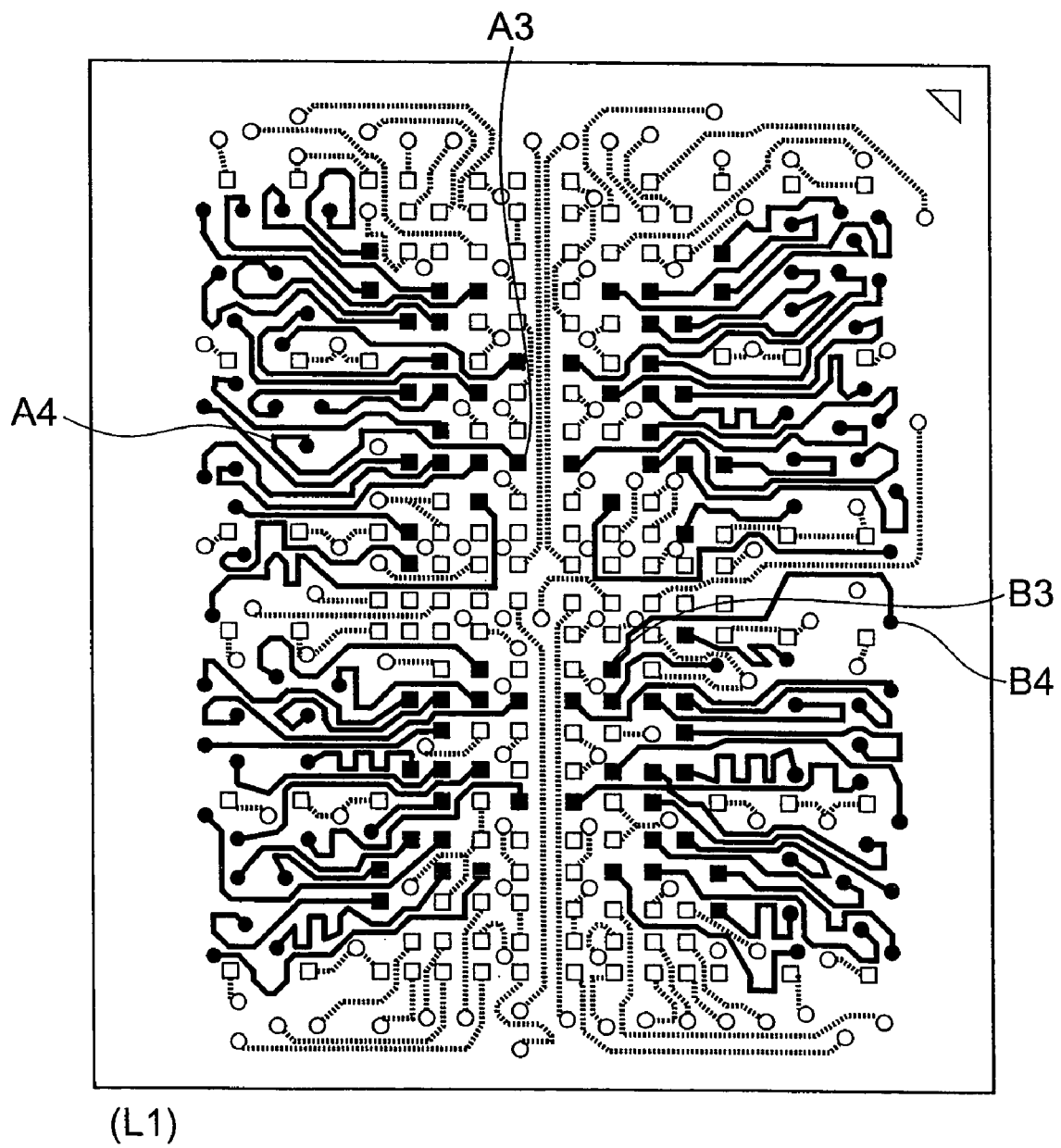
FIG. 12 is a plan view typically showing wiring paths inside a conductor layer L1 that is stacked in FIG. 10.
Figure 13:
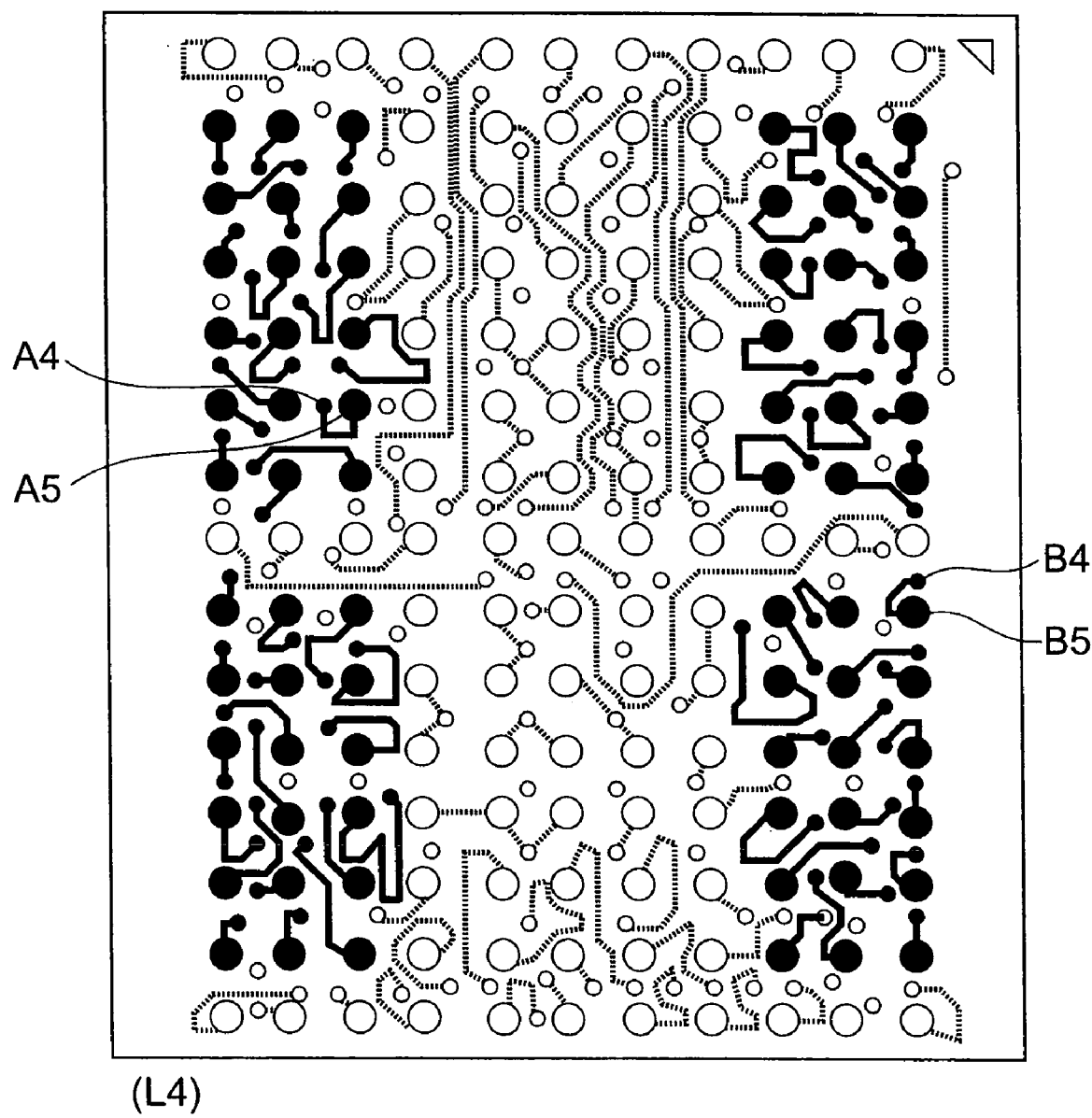
FIG. 13 is a plan view typically showing wiring paths inside a conductor layer L4 that is stacked in FIG. 12.

FIG. 12 typically shows a wiring pattern inside the conductor layer L1 stacked in FIG. 11. FIG. 13 typically shows a wiring pattern inside the conductor layer L4 stacked in FIG. 12, too. The shortest package wiring paths include a path extending from the pad electrode A1 in FIG. 10 to the bump electrode A2, a path extending from the bump land A3 in FIG. 12 to the through-hole A4 and a path extending from the through-hole A4 in FIG. 13 to the ball-like electrode A5. The longest package wiring paths include a path extending from the pad electrode B1 in FIG. 10 to the bump electrode B2, a path extending from the bump land B3 in FIG. 12 to the through-hole B4 and a path extending from the through-hole B4 in FIG. 13 to the ball-like electrode B5. The package wires thus have a large difference of wiring length and a large difference exists in the resistance components, too.

Figure 14:
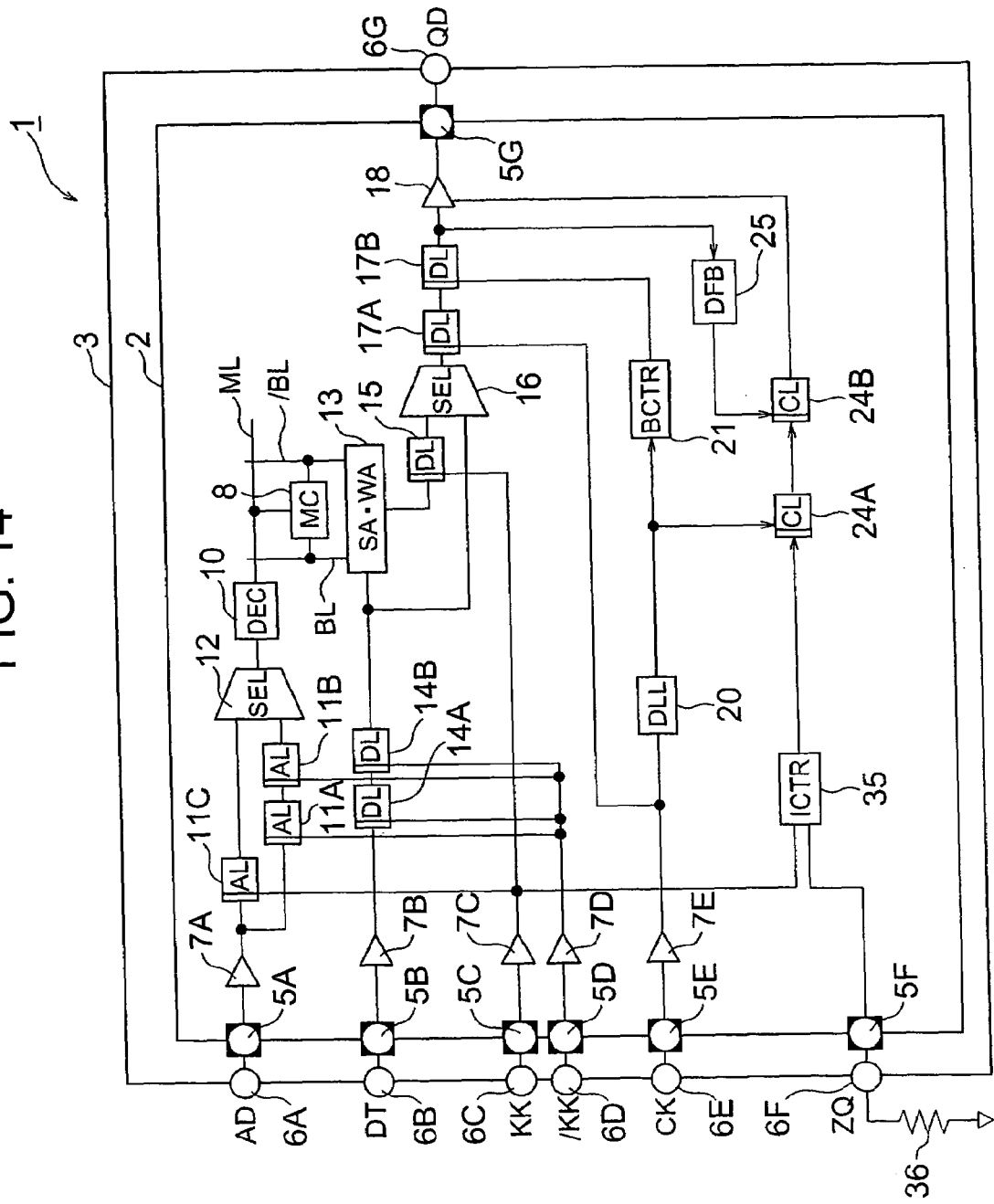
FIG. 14 is a block diagram showing as a whole the detail of an SRAM as an example of a semiconductor device according to the invention.

FIG. 14 shows in detail the entire portion of SRAM as an example of the semiconductor device according to the invention. The SRAM 1 shown in the Figure is formed on one semiconductor substrate such as single crystal silicon by a CMOS integrated circuit fabrication technology, or the like.

The SRAM 1 includes an SRAM chip 2 as a semiconductor chip (pellet) and a packaging circuit portion (hereinafter called "package", too) 3 combined with the SRAM chip 2 though the construction is not particularly restrictive. The detail of the package 3 will be explained later but a construction for face-down packaging is hereby assumed. The SRAM chip 2 has a plurality of pad electrodes 5A to 5G typically shown as external terminals. The package 3 has a plurality of external connection terminals (packaging terminals) 6A to 6G as packaging terminals for packaging the SRAM 1 to the packaging substrate (not shown in the drawing). The pad electrodes 5A to 5G are connected to the external connection terminals 6A to 6G through wires of the package 3. Symbols in the external connection terminals 6A to 6G have the following meaning. Symbol AD is an input address signal. DT is write data. KK and /KK are internal operation clocks. CK is a data output clock. ZQ is an external resistor connection terminal and QD is read data. Incidentally, "symbol/" means an inversion signal of the symbol.

One static memory cell (MC) 8 is typically shown disposed in the SRAM chip 2. Its selection terminal is connected to a word line WL and its data input/output terminals are connected to complementary bit lines BL and /BL. In practice, a large number of memory cells are arranged in matrix and constitute a memory cell array. An address decoder (DEC) 10 selects the word line WL. An address signal AD is inputted from the terminal 6A to a buffer 7A, is latched by address latches (AL) 11A to 11C in synchronism with the clock KK, /KK, is selected by a selector (SEL) 12 and is inputted to and decoded by the address decoder 10. The address latch 11C has an address counter function with a preset which is used for burst access. An amplifier circuit 13 having a sense amplifier (SA) and a write amplifier (WA)

is connected to the complementary bit lines BL and /BL. The write data DT is inputted from the terminal 6B to the buffer 7B, is latched by data latches (DL) 14A and 14B in synchronism with the clocks KK and /KK and is inputted to the amplifier circuit 13. The write amplifier of the amplifier circuit 13 drives the complementary bit lines BL and /BL in accordance with the write data. The data read out from the memory cell 8 to the complementary bit lines BL and /BL is amplified by the sense amplifier of the amplifier circuit 13, is selected by the selector 16 through the data latch 15 and is outputted from the terminal 6G through the data latches (DL) 17A and 17B and through the output buffer 18. When an instruction of a read access for the data written immediately before exists, the output of the data latch 14B is selected by the selector 16 and is outputted to the outside. Reference numerals 7C to 7E denote clock buffers. A delay loop lock (DLL) circuit 20 generates a delay clock DCK for bringing the data output timing from the terminal 6G into synchronism with the clock CK. The delay clock controls latch timing of the data latch 17B through a burst controller (BCTR) 21 and determines the data output timing. An impedance control circuit (ICTR) 23 generates an impedance code that controls impedance of the output buffer circuit 18 in accordance with the resistance value of the external resistor connected to the terminal 6F. The impedance code is supplied to the output buffer circuit 18 having a plurality of bits through control latches 24A and 24B and its output impedance is controlled. The output impedance is controlled as set control of the ON resistance of a push-pull output circuit. A data feedback circuit (DFB) 25 looks up the output level of the data latch 17B and sets the ON resistance of the output transistor on the opposite polarity side to the output operation. Because setting of the ON resistance of the output transistor on the same polarity side as the output operation is not conducted in parallel with the output operation, the possibility of undesirable fluctuation of the output level during the set operation of the ON resistance can be prevented in advance. Control of the output impedance for the output buffer circuit 18 is for establishing impedance matching with the characteristic impedance of the data transmission path to which the terminal 6G is connected.

Although the invention completed by the inventor has thus been explained concretely on the basis of the embodiment thereof, the invention is not of course limited thereto but can be changed or modified in various ways without departing from the scope thereof.

For example, the semiconductor device is not limited to the SRAM but can be applied to other clock synchronous memories such as synchronous DRAM. The semiconductor device may be a microcomputer or a data processing LSI of system-on chips. The wiring substrate used for the package is not limited to the multi-layered wiring substrate but may be a single layer wiring substrate. The number of the semiconductor integrated circuit mounted to the semiconductor device is not limited to 1 but may be a multi-chip structure.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A semiconductor device comprising a combination of a semiconductor chip having a plurality of external output buffers with a packaging circuit portion, each of said plurality of external output buffers comprising:

a first output portion having an internal impedance which can be adjusted commonly with other external output buffers in accordance with impedance control data; and a second output portion having an internal impedance which can be adjusted independently of other external output buffers, both of said first output portion and said second output portion being connected in parallel with a common output terminal to be connected to said packaging circuit portion.

2. A semiconductor device as defined in claim 1, wherein said first output portion is a push-pull circuit whose mutual conductance at the time of an output operation is variably controlled in accordance with the impedance control data.

3. A semiconductor device as defined in claim 2, wherein the push-pull circuit of said first output portion comprises a plurality of first output transistors for outputting a high level when said plurality of first output transistors are connected in parallel with said output terminal and are under an ON state; and a plurality of second output transistors for outputting a low level when said plurality of second output transistors are connected in parallel with said output terminal and are under an ON state; and the number of each of said first and second output transistors that are turned ON at the time of the output operation is controlled in accordance with said impedance control data.

4. A semiconductor device as defined in claim 2, wherein said second output portion is a push-pull circuit whose mutual conductance at the time of an output operation is independently adjusted.

5. A semiconductor device as defined in claim 4, wherein the push-pull circuit of said second output portion comprises third output transistors for outputting a high level when said third output transistors are connected in parallel with said output terminal and are under an ON state; and fourth output transistors for outputting a low level when said fourth output transistors are connected in parallel with said output terminal and are under an ON state; and a size of each of said third and fourth transistors is individually determined for each output buffer.

6. A semiconductor device as defined in claim 4, wherein an ON resistance of said second output portion at the time of the output operation establishes a first correction resistor for the second output portion and the resistance of a first correction resistor of each of said plurality of external output buffers is so determined as to compensate for variance of a resistance component of a corresponding output path of said packaging circuit portion.

7. A semiconductor device as defined in claim 6, which further comprises an impedance control circuit which generates said impedance control data, said impedance control circuit including a resistor voltage division circuit connected to an external resistance element to thereby form a predetermined voltage division node and a second correction resistor connected to said voltage division node on the opposite side to said external resistance element while interposing said predetermined voltage division node, and generating impedance control data in accordance with a voltage division level of said predetermined voltage division node.

8. A semiconductor device as defined in claim 7, wherein the resistance of said second correction resistor is determined on the basis of a resistance component of a path to which said external resistance element is connected in said packaging circuit portion and said resistance component compensated for the variance by said first correction resistor.

9. A semiconductor device as defined in claim 1, wherein said semiconductor chip includes a semiconductor substrate, a plurality of circuit elements formed on an element formation layer on said semiconductor substrate and a plurality of pad electrodes formed on a surface of said element formation layer and connected to said circuit element, wherein said packaging circuit portion includes a conductor layer connected to predetermined ones of said pad electrodes and extending on said element formation layer and bump electrodes combined with said conductor layer and constituted as a flip chip.

10. A semiconductor device as defined in claim 1, wherein said semiconductor chip includes a semiconductor substrate, a plurality of circuit elements formed on an element formation layer on said semiconductor substrate and a plurality of pad electrodes formed on a surface of said element formation layer and connected to said circuit element, wherein said packaging circuit includes a conductor layer connected to predetermined ones of said pad electrodes and extending on said element formation layer, bump electrodes formed on said conductor layer, single-layered or multi-layered wires and through-holes connected to said bump electrodes, and ball-like electrodes connected to predetermined ones of said single-layered or multi-layered wires and functioning as packaging terminals.

11. A semiconductor device comprising a combination of a semiconductor chip having a plurality of external output buffers with a packaging circuit portion, said packaging circuit portion having wires and external connection terminals connected to each of said plurality of external output buffers, and each of said plurality of external output buffers includes a first correction resistor for compensating a variance of a parasitic resistance component included in said wires and said external connection terminals, and wherein said first correction resistor is constituted by a push-pull circuit whose mutual conductance at the time of an external output operation is adjusted independently to correspond to said variance of a parasitic resistance component included in said wires and said external connection terminals.

12. A semiconductor device as defined in claim 11, wherein said plurality of external output buffers further includes another push-pull circuit whose mutual conductance at the time of an output operation is controlled variably and commonly with said plurality of external output buffers in accordance with the impedance control data.

13. A semiconductor device as defined in claim 12, which further includes an impedance control circuit for generating said impedance control data, wherein said impedance control circuit includes a resistor voltage division circuit connected to an external resistance element and forming a predetermined voltage division node and a second correction resistor connected to said voltage division node on the opposite side to said external resistance element while interposing said voltage division node, and generates impedance control data in accordance with a voltage division level of said predetermined voltage division node.

14. A semiconductor device as defined in claim 13, wherein the resistance of said second correction resistor is determined on the basis of a resistance component of a path to which said external resistance element is connected in said packaging circuit portion and the resistance component variance of which is compensated for by said first correction resistor.

* * * * *